(12) United States Patent
Makabe

(10) Patent No.: US 10,622,470 B2
(45) Date of Patent: Apr. 14, 2020

(54) PROCESS OF FORMING NITRIDE SEMICONDUCTOR DEVICE

(71) Applicant: SUMITOMO ELECTRIC INDUSTRIES, LTD., Osaka (JP)

(72) Inventor: Isao Makabe, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/056,127

(22) Filed: Aug. 6, 2018

(65) Prior Publication Data

US 2019/0043978 A1 Feb. 7, 2019

(30) Foreign Application Priority Data

Aug. 7, 2017 (JP) ................. 2017-152652

(51) Int. Cl.
*H01L 29/778* (2006.01)
*H01L 29/20* (2006.01)
*H01L 29/66* (2006.01)
*H01L 29/08* (2006.01)

(52) U.S. Cl.
CPC ...... *H01L 29/7787* (2013.01); *H01L 29/0843* (2013.01); *H01L 29/66462* (2013.01); *H01L 29/2003* (2013.01)

(58) Field of Classification Search
None
See application file for complete search history.

(56) References Cited

U.S. PATENT DOCUMENTS

| | | | | |
|---|---|---|---|---|
| 2002/0020436 | A1* | 2/2002 | Bergman | B08B 3/02 134/30 |
| 2003/0082860 | A1* | 5/2003 | Yoshida | H01L 21/28575 438/184 |
| 2005/0189651 | A1* | 9/2005 | Hirose | H01L 21/28575 257/745 |
| 2005/0258450 | A1* | 11/2005 | Saxler | H01L 29/0649 257/192 |
| 2006/0124962 | A1 | 6/2006 | Ueda et al. | |
| 2008/0118999 | A1* | 5/2008 | Komada | H01L 33/007 438/46 |
| 2008/0176366 | A1 | 7/2008 | Mita et al. | |
| 2015/0311333 | A1* | 10/2015 | Ozaki | H01L 29/7786 257/76 |

(Continued)

FOREIGN PATENT DOCUMENTS

| | | |
|---|---|---|
| JP | 2006-173241 | 6/2006 |
| JP | 2006-190991 | 7/2006 |
| JP | 2008-124262 | 5/2008 |

*Primary Examiner* — Angel Roman
(74) *Attorney, Agent, or Firm* — Smith, Gambrell & Russell, LLP.

(57) ABSTRACT

A process of forming a semiconductor device primarily made of nitride semiconductor materials is disclosed. The process includes steps of: (a) growing a semiconductor stack including a channel layer and a barrier layer sequentially on a substrate, where the channel layer is made of gallium nitride (GaN); (b) patterning a mask on the barrier layer; (c) etching a portion of the barrier layer and a portion of the channel layer with the mask to form a recess in the semiconductor stack; and (d) growing a contact layer selectively within the recess with nitrogen ($N_2$) used as a carrier gas at a maximum temperature of 1000° C.

9 Claims, 10 Drawing Sheets

(56) References Cited

U.S. PATENT DOCUMENTS

2017/0141218 A1* 5/2017 Iucolano ............ H01L 21/0254
2017/0263743 A1* 9/2017 Nakata ............... H01L 21/0254
2017/0309712 A1* 10/2017 Yamada .............. H03F 1/3247

* cited by examiner

PROCESS OF FORMING NITRIDE SEMICONDUCTOR DEVICE

CROSS REFERENCE TO RELATED APPLICATION

The present application is based on and claims benefit of priority of Japanese Patent Application No. 2017-152652, filed on Aug. 7, 2017, entire content of which is incorporated herein by reference.

BACKGROUND OF INVENTION

1. Field of Invention

The present invention relates to a process of forming a nitride semiconductor device, in particular, the process of forming a contact layer of the nitride semiconductor device.

2. Background Arts

A high electron mobility transistor (HEMT) primarily made of nitride semiconductor materials including gallium nitride (GaN) has been well known in the field. Such electron devices made of nitride semiconductor materials and having a HEMT structure are operable in high speed and at high voltage. One subject left in a semiconductor device type of the HEMT is that a channel layer, or a channel, thereof only has relatively smaller carrier density. Various trials for increasing the carrier density in the channel have been done. Japanese Patent Applications laid open Nos. JP-2006-173214A, JP2006-190991, and JP-2008-124262A have disclosed HEMTs including a gallium nitride (GaN) layer and an aluminum gallium nitride (AlGaN) layer stacked on the GaN layer, where those two layers induce a two dimensional electron gas (2DEG) operable as a channel layer in an interface therebetween, exactly, in the GaN layer next to the interface against the AlGaN layer. Such HEMTs may show excellent modulating performance in high frequencies.

In order to enhance high frequency performance of a HEMT, which is equivalent to increase a cut-off frequency thereof, reduction of junction capacitance between a source electrode and a gate electrode, Cgs, and/or reduction of resistance of ohmic electrodes and between ohmic electrodes and a channel is inevitable, where the reduction of the resistance equivalently means an increase of trans-conductance. Another technique to enhance the trans-conductance is to make a barrier layer thinner. Regrowth of $n^+$-GaN layers selectively in regions to be converted into the source electrode and the drain electrode using a mask made of insulating film, which has been disclosed in a Japanese Patent Application laid open No JP-2008-1242626A, is an effective technique to reduce the contact resistance and the access resistance.

However, when a GaN layer is selectively and epitaxially grown using a non-crystallized mask, source materials for gallium (Ga) and nitrogen (N) have enough migration length and move to stable sites with lower potential energy that are on a surface of a semiconductor layer exposed from the non-crystallized mask. Accordingly, source materials tend to be collected in areas closer to the non-crystalized mask. The GaN layer thus selectively grown inevitably has an uneven distribution in a thickness thereof, that is, the GaN layer in the thickness thereof becomes greater in areas closer to the mask.

SUMMARY OF INVENTION

An aspect of the present invention relates to a process of forming a semiconductor device that is primarily made of nitride semiconductor materials. The process comprises steps of: (a) growing a semiconductor stack including a channel layer and a barrier layer sequentially on a substrate, where the channel layer is made of gallium nitride (GaN) on a substrate; (b) patterning a mask on the semiconductor stack; (c) etching a portion of the barrier layer and a portion of the channel layer in the semiconductor stack using the mask to form a recess in the semiconductor stack; and (d) growing a contact layer selectively within the recess using nitrogen ($N_2$) as a carrier gas at a temperature of 1000° C. at highest.

BRIEF DESCRIPTION OF THE DRAWINGS

The invention will now be described by way of example only with reference to the accompanying drawings in which:

FIG. 10A shows a surface of the n-type GaN layer, while.

DESCRIPTION OF EMBODIMENTS

Figure 1:
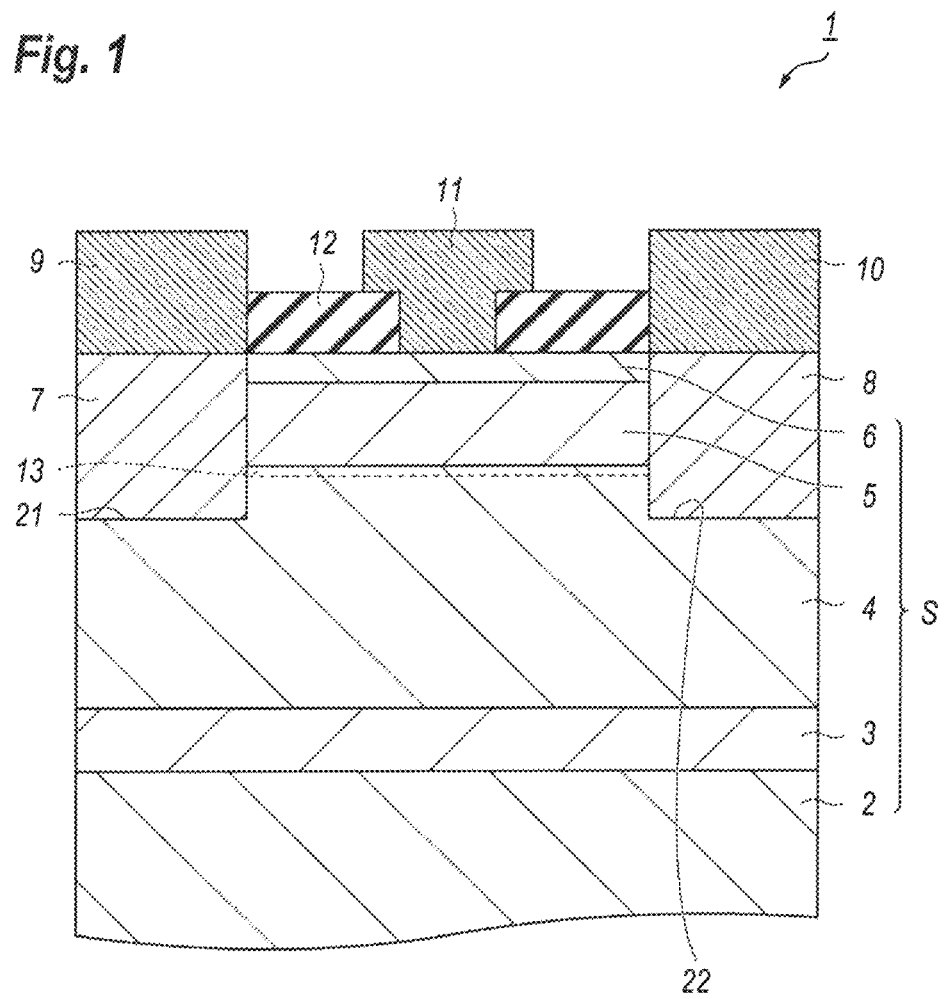
FIG. 1 shows a cross section of a nitride semiconductor device according to an embodiment of the present invention.

FIG. 1 shows a cross section of a semiconductor device type of high electron mobility transistor (HEMT) primarily made of nitride semiconductor materials. The HEMT 1 shown in FIG. 1 includes a substrate 2, a buffer layer 3, a channel layer 4, a barrier layer 5, a cap layer 6, contact layers, 7 and 8, electrodes of a source 9, a drain 10, and a gate 11, and a passivation film 12. The semiconductor layers from the buffer layer 3 to the cap layer 6 are stacked on the substrate 2 in this order to constitute a semiconductor stack S.

The substrate 2 may be made of silicon carbide (SiC). The buffer layer 3, which may operate as a seed layer, or often called as a nucleus forming layer for growing a channel layer on an SiC substrate, may be made of aluminum nitride (AlN) with a thickness of 10 to 20 nm. Because the buffer layer 3 is grown thin with a thickness less than 20 nm, the grown buffer layer 3 often forms islands not continuously or homogeneously extending on the substrate 2.

The channel layer 4, which may operate as a carrier transporting layer, is grown on the buffer layer 3 as an intrinsic type (i-type), where an i-type material is not intentionally doped. Because of wettability of a gallium nitride (GaN) against a silicon carbide (SiC), where the former is the material for the channel layer 4, while the latter is the material of the substrate 2; the GaN channel layer 4 is inevitable to be grown on the substrate 2 as interposing the AlN buffer layer 3. The channel layer 4 may have a thickness of 400 to 2000 nm.

The barrier layer 5, which may operate as a carrier supplying layer, is epitaxially grown on the channel layer 4. The barrier layer 5 may be made of aluminum gallium nitride (AlGaN) and/or a nitride semiconductor material containing indium (In) such as indium aluminum nitride (InAlN), indium aluminum gallium nitride (InAlGaN), and so on. The HEMT 1 of the present embodiment provides the barrier layer 5 made of AlGaN. The barrier layer 5 has a lattice constant different from that of the channel layer 4, which causes stresses in the channel layer 4 and the barrier layer 5 close to an interface therebetween and induces charges by the Piezo effect originating to crystal structures of the channel layer 4 and the barrier layer 5. The Piezo charges form a two dimensional electron gas (2DEG) in the channel layer 4 at the interface against the barrier layer 5, and the 2DEG becomes a channel 13 for the carrier transportation. The barrier layer 5 may have a thickness of 5 to 20 nm, and may be doped with n-type impurities. When the barrier layer 5 is doped with n-type impurities, charges, exactly electrons derived from the donors in the barrier layer 5 are added to the Piezo charges in the channel. Also, when the barrier layer 5 is made of AlGaN, the aluminum composition [Al] thereof is 10 to 35%.

The cap layer 6, which may be made of GaN, is epitaxially grown on the barrier layer 5. The cap layer 6 preferably has a thickness less than 5 nm. That is, a HEMT is unnecessary to provide the cap layer 6. The cap layer 6 may be also doped with n-type impurities.

The contact layers, 7 and 8, which may be made of GaN, are selectively grown within recesses, 21 and 22, formed on the semiconductor stack S. The contact layers, 7 and 8, may be, as described above, GaN. In an alternate, the contact layers, 7 and 8, may be made of indium gallium nitride (InGaN) or AlGaN heavily doped with n-type dopants. The HEMT1 of the present embodiment provides the contact layers, 7 and 8, made of GaN with a doping concentration of $1 \times 10^{19}$ to $1.0 \times 10^{21}$ [cm$^{-3}$], preferably in a range of $5 \times 10^{19}$ to $5 \times 10^{20}$ [cm$^{-3}$]. The doping concentration greater than $5 \times 10^{19}$ [cm$^{-3}$] may make sheet resistance of the contact layers, 7 and 8, smaller than 100 ohm/square by thickening the contact layers, 7 and 8, greater than 100 nm. N-type dopants may be silicon (Si), germanium (Ge), tellurium (Te), and so on. The contact layers, 7 and 8, may be made of n-type AlGaN as far as the contact layers, 7 and 8, are doped by density at least $1 \times 10^{20}$ [cm$^{-3}$]. The AlGaN contact layers, 7 and 8, may have aluminum composition [Al] smaller than 10%, which may not only effectively prevent a 2DEG from being induced in an interface between the contact layers, 7 and 8, and the channel layer 4 but make a difference in lattice constants of the layers smaller, which may effectively prevent the contact layers, 7 and 8, from causing cracks.

The electrodes of the source 9 and the drain 10 are provided on the contact layers, 7 and 8, respectively. Specifically, the source 9 is in contact with the contact layer 7 within the recess 21, while, the drain electrode 10 is in contact with the other contact layer 8 formed within another recess 22. The source and drain electrodes, 9 and 10, are formed by alloying a stacked metals containing titanium (Ti) and aluminum (Al). Electrode containing tantalum (Ta) and aluminum (Al) may also be applicable to the ohmic electrodes, 9 and 10, of the HEMT 1. The gate electrode 11, which is in contact with the cap layer 6, provides another stacked metal of nickel (Ni) and gold (Au). The passivation film 12, which may be made of silicon nitride (SiN), covers the cap layer 6.

Next, a process of forming the HEMT 1 according to an embodiment of the present invention will be described as referring to FIG. 2A to FIG. 3C each showing cross sections of the HEMT 1 at respective steps of the process.

Figure 2A:
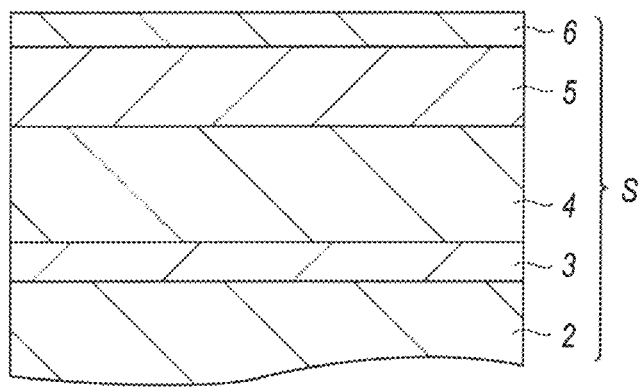
FIG. 2A to FIG. 2C show process of forming the nitride semiconductor shown in FIG. 1.

First, as shown in FIG. 2A, the process epitaxially grows the semiconductor stack S on the substrate 2 by, for instance, the metal organic chemical vapor deposition (MOCVD) technique that is well known in the field. Specifically, the process sequentially grows the buffer layer 3, the channel layer 4, the barrier layer 5, and the cap layer 6 on the substrate 2 without carrying the substrate 2 out of a growth chamber of the MOCVD apparatus. Thus, the semiconductor stack S made of nitride semiconductor materials is formed on the substrate 2.

Figure 2B:
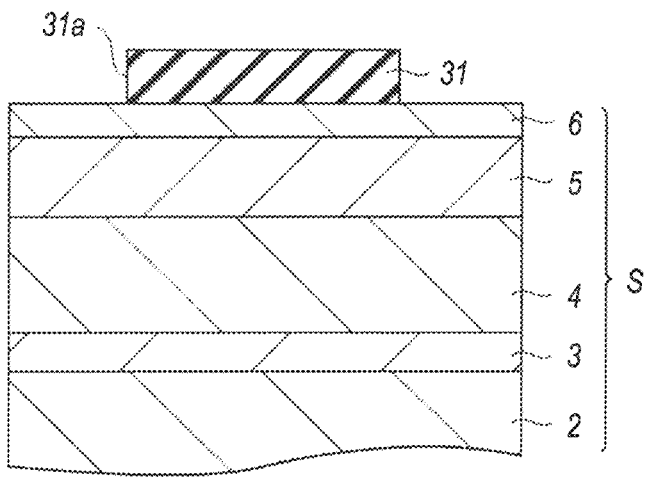

Thereafter, as shown in FIG. 2B, the process prepares a mask 31 on the semiconductor stack S using, for instance, a plasma assisted chemical vapor deposition (p-CVD) technique or a sputtering, which are also well known in the field, and a lithography carried out subsequent to the deposition of the mask 31. The mask 31 may be made of material easily removal from the semiconductor stack S even after a heat treatment at a temperature higher than 800° C. The mask 31, which may be made of inorganic material, has patterns with an opening 31a through which a surface of the semiconductor stack S exposes. In an example, the mask 31 may be an inorganic insulating film containing silicon (Si), such as silicon nitride (SiN), silicon oxide (SiO$_2$), and/or silicon oxy-nitride (SiON), where those materials containing Si are easily removed using fluoric acid, or other materials containing aluminum (Al) such as aluminum oxide (Al$_2$O$_3$), and/or aluminum oxy-nitride (AlON). The mask 31 may have a thickness around 50 nm.

Figure 2C:
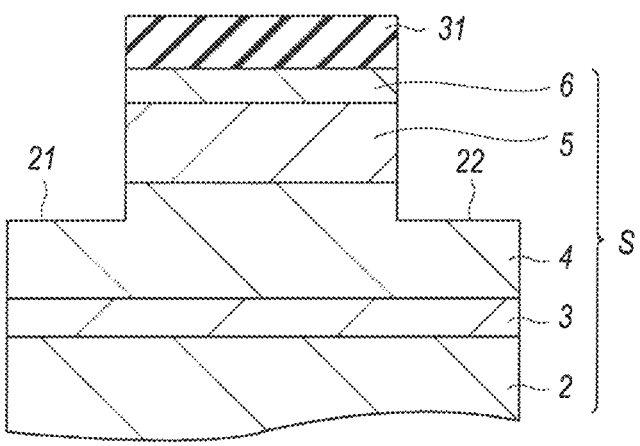

Thereafter, as shown in FIG. 2C, the process etches a portion of the semiconductor stack S to form recesses, 21 and 22. Specifically, a portion of the cap layer 6 exposed within the opening 31a, a portion of the barrier layer 5 exposed within an opening in the cap layer 6, a portion of the channel layer 4 exposed within an opening in the barrier layer 5 are dry-etched. A wet-etching subsequent to form the recesses, 21 and 22, may remove residues left within the recesses, 21 and 22. A reactive ion etching (RIE) using a reactive gas containing chloride (Cl) may be used for forming the recesses, 21 and 22; while the wet-etching subsequent to the RIE may use a mixture of sulfuric acid and hydrogen peroxide. The recesses, 21 and 22, thus formed have bottoms in the channel layer 4, whose depth is around 100 nm, and sides exposing the barrier layer 5 and the cap layer 6.

Figure 3A:
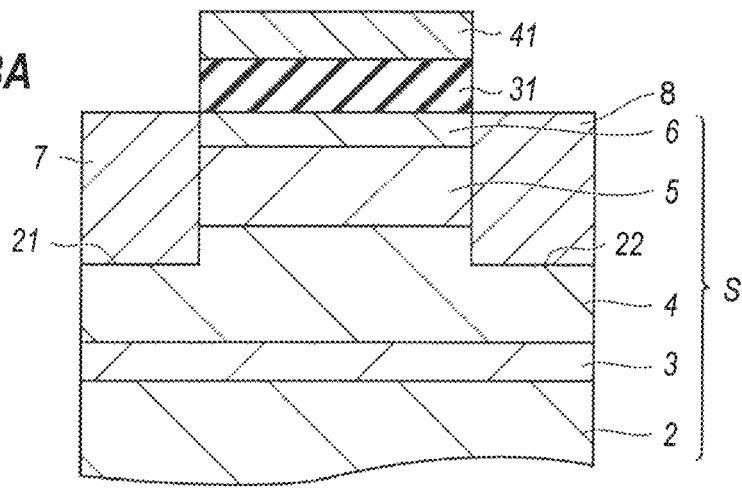
FIG. 3A to FIG. 3C show process of forming the nitride semiconductor device subsequent to the process shown in FIG. 2C
Figure 3B:
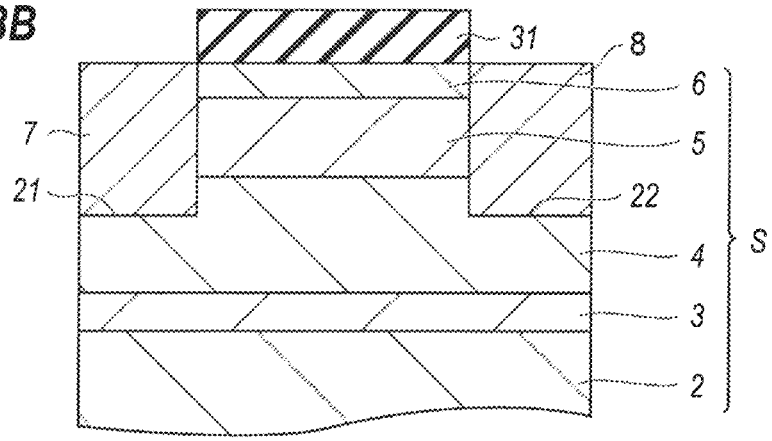
Figure 3C:
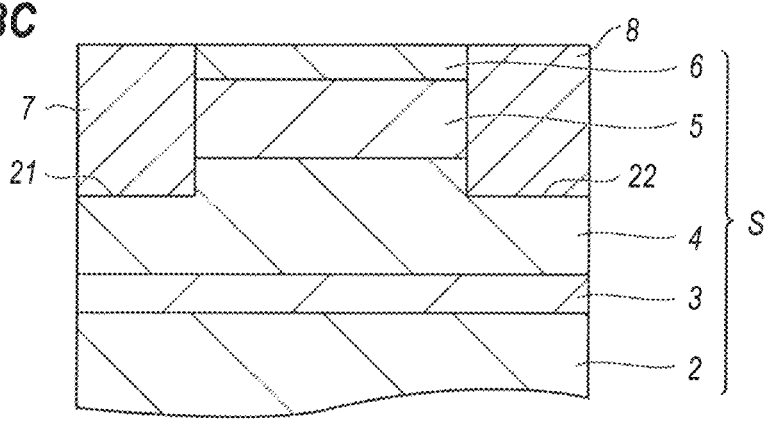

Thereafter, as shown in FIG. 3A, the process selectively grows the contact layers, 7 and 8, within the recesses, 21 and 22. The present embodiment grows n-type GaN layers as the contact layers, 7 and 8. Because the bottoms of the recesses, 21 and 22, locate in the channel layer 4, the contact layers, 7 and 8, thus selectively grown on the channel layer 4 become substantially single crystals whose crystal orientation reflects that of the channel layer 4. For instance, the channel layer 4 in the surface thereof has the c-axis in the crystal orientation, the contact layers, 7 and 8, also have the crystal orientation of the c-axis.

Describing the process shown in FIG. 3A further specifically, the process loads the substrate 2 within a growth chamber, then raises a temperature of the substrate 2 within a mixed atmosphere of nitrogen ($N_2$) and ammonia ($NH_3$) in order to suppress sublimation of atoms from the surface of the semiconductor stack S, that is, the exposed surface of the channel layer 4 in the recesses, 21 and 22. Thereafter, changing the atmosphere from the mixed gas above described to a unique gas of nitrogen ($N_2$), and setting conditions within the grown chamber to be a pressure of 100 Torr (133 kPa) and a temperature of 1000° C., the selective growth of the contact layers, 7 and 8, of an n-type GaN by a thickness around 100 nm are carried out by introducing source gases within the growth chamber. Thus, nitrogen ($N_2$) operates as the carrier gas for supplying source materials within the growth chamber of the MOCVD apparatus. The source gases are tri-methyl-gallium (TMG) for gallium (Ga) and ammonia ($NH_3$) for nitrogen (N). The source gases may accompany with dopant gas of silane ($SiH_4$).

A growth temperature of 1000° C. at highest may suppress re-vaporization from a surface of the grown GaN layer and migration of source materials for gallium (Ga) and nitrogen (N) on the mask 31. When the semiconductor stack S includes a material containing indium (In), the temperature for selectively growing the contact layers, 7 and 8, is preferably set lower than 800° C. in order to avoid degradation in crystal quality of the semiconductor stack S. Also, from a view point of further suppressing the migration of the source materials for gallium (Ga) and nitrogen ($N_2$) on the mask 31, the growth temperature is preferably lower than 700° C. The carrier gas of nitrogen ($N_2$) may further suppress the migration of the source materials compared with a case where the carrier gas is hydrogen ($H_2$) because nitrogen ($N_2$) shows higher viscosity than hydrogen ($H_2$).

Also, from a viewpoint that the grown contact layers, 7 and 8, should contain smaller carbon atoms because carbon (C) operates as a p-type dopant in nitride semiconductor materials, tri-ethyl-gallium (TEG) may be used as a source material for gallium (Ga). A contact layer grown using TEG may show the carbon concentration less than $2 \times 10^{17}$ cm$^{-3}$, which means that the grown contact layers, 7 and 8, may increase silicon [Si] concentration, where silicon behaves as an n-type dopant in a GaN layer, and increases the conductivity of the grown layer. Another technique such as the molecular beam epitaxy (MBE) may also selectively grow the contact layers, 7 and 8; but, the MBE technique generally shows lesser productivity compared with the MOCVD technique.

As described, the process grows the GaN layer not only selectively within the recesses, 21 and 22, but on the mask 31, which is often called as a residue 43a. The residue 43a, contrary to the contact layers, 7 and 8, usually shows lesser crystal quality or usually becomes poly-crystal.

The process thereafter removes the residue 43a on the mask 31 by an etchant having an alkali characteristic. Because the contact layers, 7 and 8, become single crystals while the residue 43a becomes a poly-crystal, an alkali etchant may easily solve the residue 43a selective to the contact layers, 7 and 8. Sodium hydro-oxide (NaOH), ammonium hydro-oxide ($NH_4OH$), and so on may be used as the alkali etchant. The present embodiment removes the residue 43a by soaking the substrate 2 within a mixture of ammonium hydro-oxide, hydrogen peroxide, and water ($NH_4OH:H_2O_2:H_2O=1:1:60$) for one hour at 60° C. to remove the residue 43a.

Thereafter, the process removes the mask 31. Specifically, a fluoric acid (HF) may easily solve the mask 31 when the mask 31 is made of inorganic material containing silicon (Si). After removal of the mask 31, the process forms the electrodes of the source 9, the drain 10, and the gate 11, and thereafter covers the electrodes, 9 to 11, the semiconductor stack S, and the contact layers, 7 and 8, each exposed between the electrodes, 11 and 13, with the passivation film 12. Thus, the process of forming the HEMT 1 according to the present embodiment is completed.

Figure 4A:
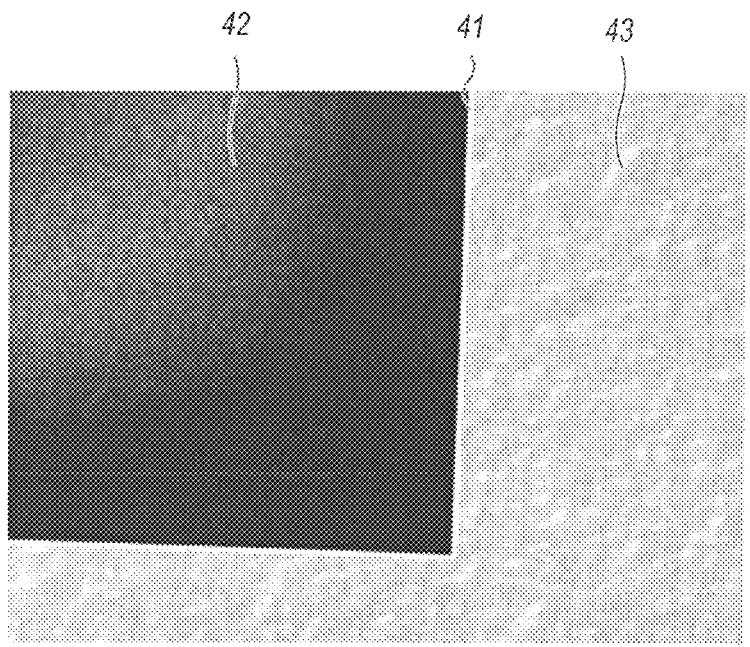
FIG. 4A is a photograph of surfaces of a selectively grown semiconductor layer and a mask using hydrogen ($H_2$) as a carrier gas, and FIG. 4B magnifies the first region appearing in FIG. 4A.
Figure 5A:
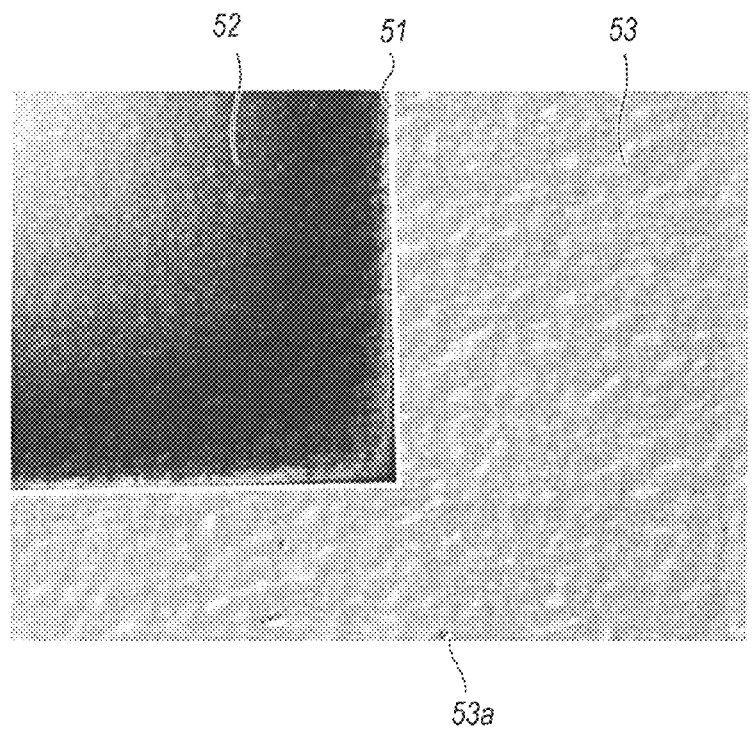
FIG. 5A is a photograph of surfaces of a selectively grown semiconductor layer and a mask using nitrogen ($N_2$) as the carrier gas, and FIG. 5B magnifies the first region in FIG. 5A FIG. 6 schematically explains a current flow between the electrodes without any contact layers.

Next, an advantage of using nitrogen ($N_2$) instead of hydrogen ($H_2$) as the carrier gas at the step of selective growth of the contact layers, 7 and 8, will be described. FIG. 4A is a photograph of the surface of the contact layer, 7 or 8, and that of the mask 31 when the selective growth was carried out using hydrogen ($H_2$) as the carrier gas; while, FIG. 5A is another photograph of those surfaces when the selective growth was carried out using nitrogen ($N_2$) as the carrier gas. In those figures, the selective growth of the contact layer, namely, an n-type GaN layer, was carried out at 800° C.

Figure 4B:
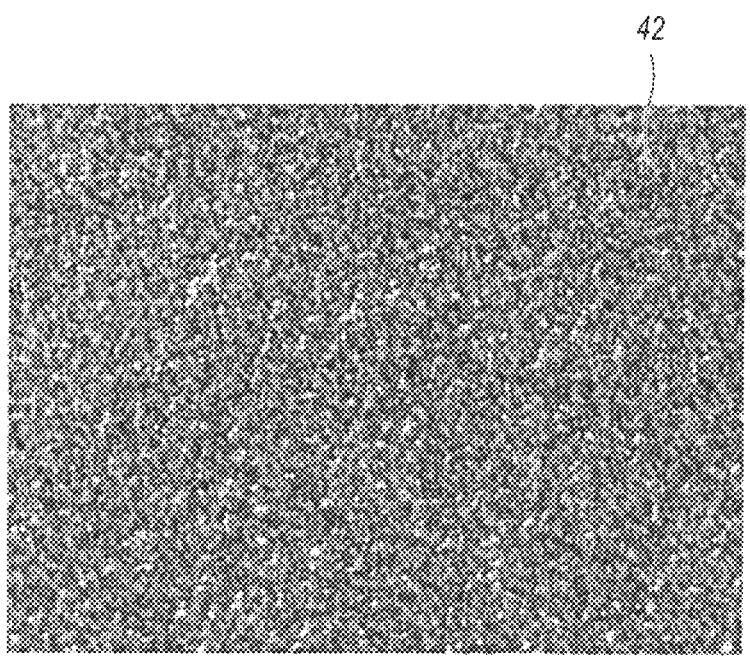

FIG. 4A distinguished the first region 42 from the second region 43 by the boundary 41. The first region 42 corresponded to an area within an opening provided in the mask 31, to which the selective growth of the GaN layer was carried out; while, the second region 43 was an area on the mask 31. In FIG. 4A, undulations of the surface of the semiconductor stack S was viewed through the mask 31, which is transparent for visible light, because a migration length of the source materials, Ga and N, becomes large such that almost all source materials, Ga and N, run on the mask 31 and falls on the first region 42 where the surface of the semiconductor stack S exposes. That is, almost no residue 43a was left on the mask 31. FIG. 4B magnifies the first region 42 shown in FIG. 4A. As shown in FIG. 4B, no crystalline structure was found in the first region 42. That is, source materials, Ga and N, fallen directly within the opening in the mask 31 and indirectly therein from the second region 43 on the mask formed no crystalline structure. Accordingly, substantially no shade appeared in the first region 42 shown in FIG. 4A.

Figure 5B:
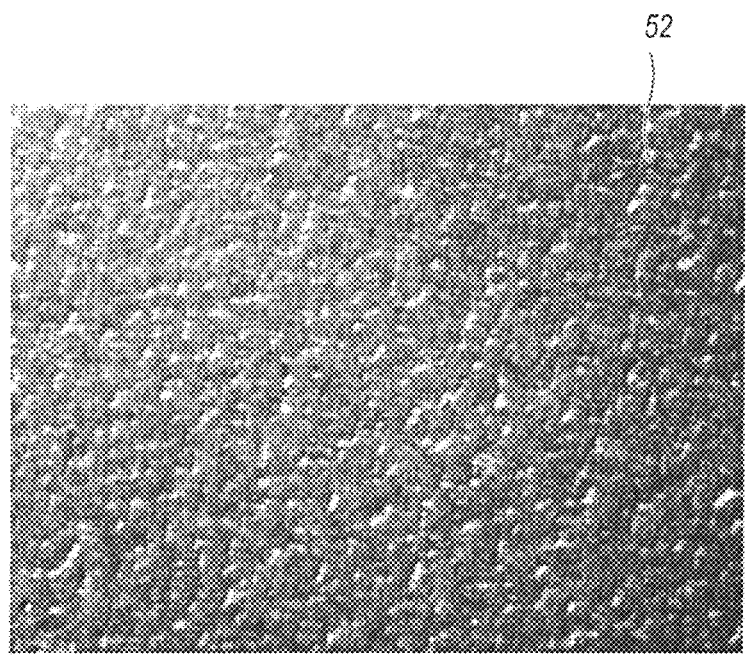

Referring to FIG. 5A, FIG. 5A also divided the first region 52 from the second region 53 by the boundary 51, and substantial shade was recognized in the first region 52. FIG. 5B magnifies the first region 52 in FIG. 5A. As shown in FIG. 5B, undulations similar to the surface of the semiconductor stack shown in the second region 43 in FIG. 4A and that shown in FIG. 5A was recognized in the first region 52, which means that first region 52 formed a crystal structure. The undulation also appeared in the second region 53 in FIG. 5B, which means, but some projections 53 were also recognized on the mask 31, which means that almost whole source materials, Ga and N, fallen onto the mask 31 runs thereon toward the edge of the mask 31 and accumulated within the opening of the mask 31 to make the grown GaN layer thicker there. Accordingly, substantial shade appeared in the first region 52.

Figure 6:
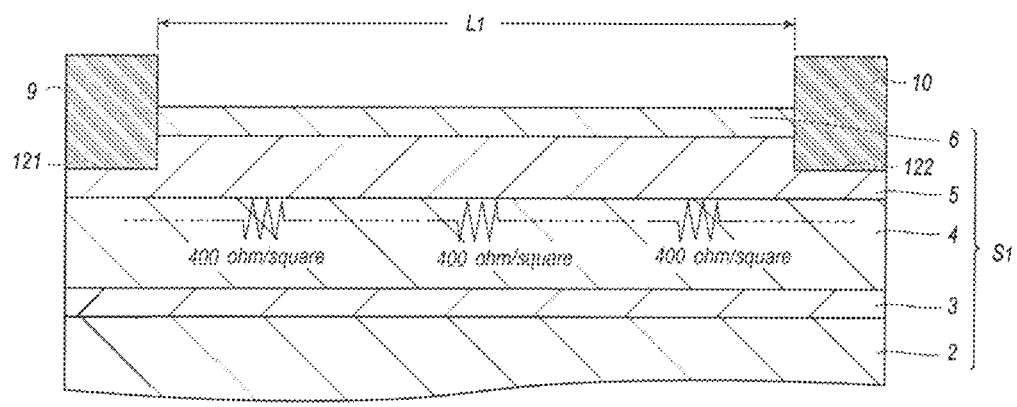
Figure 7:
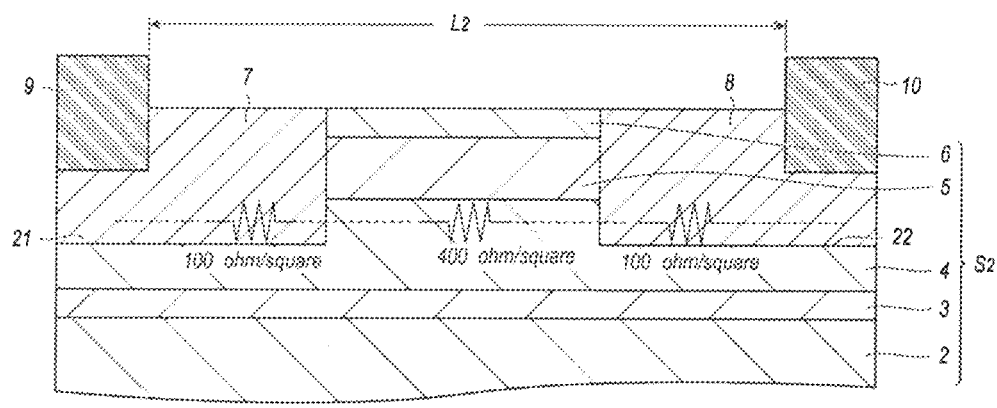
FIG. 7 explains the current flow between the source and the drain in an arrangement providing the contact layers.

Next, current flows between the source and the drain electrodes, 9 and 10, in two cases of no contact layers and accompanying with the contact layers will be described referring to FIG. 6 and FIG. 7. FIG. 6 schematically explains the current flow between the electrodes without any contact layers; while, FIG. 7 explains the current flow between the source 9 and the drain 10 in an arrangement accompanying with the contact layers, 7 and 8. That is, the electrodes of the source 9 and the drain 10 are formed by partly etching the barrier layer 5 and the cap layer 6 but the channel layer 4 to dig the recesses, 121 and 122, in FIG. 6. Accordingly, the recesses, 121 and 122, provide bottoms in the barrier layer 5. In FIG. 6 and FIG. 7, respective distances, $L_1$ and $L_2$ between the source 9 and the drain 10 are set to be equal to each other. Also in FIG. 7, a length of the contact layers, 7 and 8, from an edge against the electrodes, 9 and 10, to an edge of the barrier layer 5 and a length of the barrier layer 5 are set to be 3:4; that is, the barrier layer 5 has a length of 40% of the distance between the electrodes, 9 and 10.

In the semiconductor stack $S_1$ shown in FIG. 6 of a conventional arrangement, the current flows from the drain 10 to the source 9 within the channel layer 4; while, in the semiconductor stack $S_2$ of the embodiment shown in FIG. 7, the current flows in the contact layers, 7 and 8, and the channel layer 4. Because the channel layer 4 is made of i-type GaN, namely, intentionally doped with no dopants, while, the contact layers, 7 and 8, are made of n-type GaN, the contact layers, 7 and 8, may have sheet resistance of, for instance, around 100 ohm/square while the channel layer 4 has sheet resistance of, for instance, around 400 ohm/square. Accordingly, the semiconductor stack $S_2$ in the present embodiment shown in FIG. 7 may decrease resistance between the electrodes, 9 and 10, which means that the HEMT 1 derived from the semiconductor stack $S_2$ shown in FIG. 7 may reduce the access resistance from the electrodes, 9 and 10, to the 2DEG in the channel layer 4 compared with a HEMT derived from the semiconductor stack $S_1$ shown in FIG. 6.

Thus, as described above, the HEMT 1 of the present embodiment provides the contact layers, 21 and 22, made of n-type GaN that are selectively grown at a temperature lower than 1000° C. using nitrogen ($N_2$) as the carrier gas. Such a process for selectively growing a nitride semiconductor layer may make the grown layer homogeneous in the thickness thereof. Moreover, the selective growth is carried out so as to fill the recesses, 21 and 22, formed in the cap layer 6, the barrier layer 5, and a portion of the channel layer 4; that is, the bottoms of the contact layers, 7 and 8, locate in the channel layer 4, which may effectively lower not only the contact resistance of the electrodes of the source 9 and the drain 10 but the access resistance from those electrodes, 9 and 10, to the 2DEG in the channel layer 4.

The contact layers, 7 and 8, may be grown by the n-type GaN using the TEG as a source gas for gallium (Ga), which may effectively reduce the carbon concentration in the grown layer even when the growth is carried at a temperature lower than 1000° C., where carbons behave as acceptors in the contact layers, 7 and 8. The mask 31 may be made of inorganic material containing silicon (Si), typically, silicon nitride (SiN) and/or silicon oxide ($SiO_2$). An alkali etchant may remove the residue 43a left on the mask 31, which may suppress reattachment of the residue 43a onto the grown layers, 7 and 8, compared with a case where the residue 43a are removed by a lift-off process that solves the mask 31 using fluoric acid.

In a modification, when the barrier layer 5 includes indium (In), the selective growth for the contact layers, 7 and 8, may be preferably carried out at a temperature lower than 800° C. in order to suppress degradation in the crystal quality of the barrier layer 5 and in the interface between the barrier layer 5 and the channel layer 4. The 2DEG in the channel layer 4 may be effectively induced.

Figure 8A:
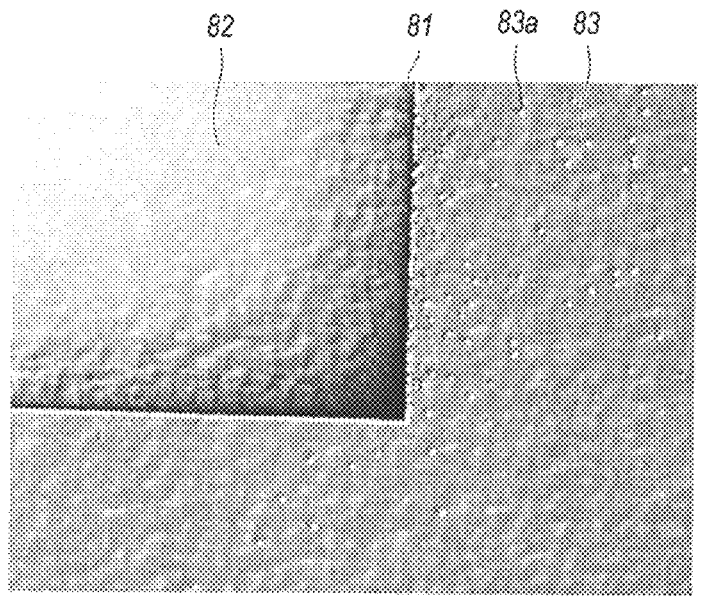
FIG. 8A is a photograph of surfaces of a GaN layer and the mask after the selective growth at 660° C., and FIG. 8B magnifies the first region in FIG. 8A.
Figure 8B:
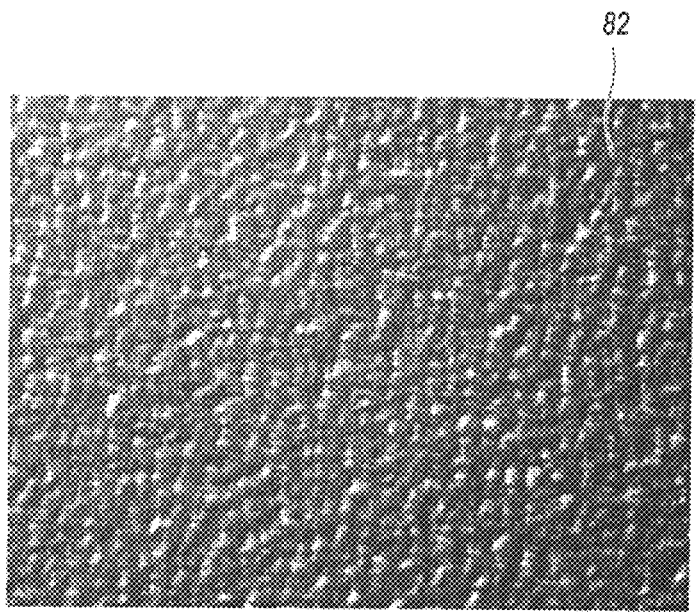

Referring to FIG. 8A, a photograph of surfaces of a GaN layer and residues on a mask after the selective growth of the GaN layer at 660° C. are shown, where the regions, 82 and 83, show the surface of the selectively grown GaN layer and that of the mask, respectively, and the boundary 81 between two areas, 82 and 83, corresponds to the edge of the mask. The first region 82 shows an undulation similar to those recognized in the surface of the semiconductor stack S observed through the mask 31 and a substantial shade but a difference in the shade, namely, a difference between light and dark, becomes smaller than the that appearing in the first region 52 shown in FIG. 5A. FIG. 8B magnifies the first area 82, which also shows the shade but the difference thereof becomes smaller than that appearing in the first region 52 shown in FIG. 5B. Moreover, the second region 83 shown in FIG. 8A caused many residues 83a compared with those shown in FIG. 5A, which means that the source materials, Ga and N, in the migration lengths thereof were further shortened and increased a ratio that source materials combined to each other on the mask 31.

In order to reduce the contact resistance of the contact layers, 7 and 8, a semiconductor material having bandgap energy smaller than that of the channel layer 4 becomes effective. For instance, a nitride semiconductor material containing indium (In), such as n-type InGaN, n-type InN, and so on may be effective for reducing the contact resistance when the channel layer 4 is made of GaN. However, such nitride semiconductor materials containing In is unavoidable to limit doping density of silicon (Si) to be $5 \times 10^{19}$ $cm^{-3}$ at most. Such limitation in the maximum doping density of Si is also applied to GaN. However, another nitride semiconductor material, namely, aluminum gallium nitride (AlGaN), appears to be free from such a limited doping concentration of Si. Specifically, an AlGaN layer may be doped with Si by density of $1 \times 10^{20}$ $cm^{-3}$ or higher. That is, the contact layers, 7 and 8, selectively grown within the recesses, 21 and 22, using the mask 31 may be made of n-type AlGaN doped with Si by density higher than $5 \times 10^{19}$ $cm^{-3}$ but lower than $1 \times 10^{21}$ $cm^{-3}$. This is because of differences in atomic diameters between aluminum (Al) and silicon (Si), and between gallium (Ga) and silicon (Si). The former difference between Al and Si is smaller than the latter difference between Ga and Si. Thus, silicon (Si) atoms substituting into aluminum (Al) sites are more stable than that into gallium (Ga) or indium (In) sites.

In addition, a difference in lattice constants between AlGaN and GaN is smaller than that between InGaN and GaN. Accordingly, when the recesses, 21 and 22, in the bottom thereof locates in the GaN channel layer 4, the AlGaN contact layers, 7 and 8, selectively grown within the recesses, 21 and 22, may enhance crystal quality compared with the InGaN contact layers selectively grown within the recesses, 21 and 22. Accordingly, the AlGaN contact layer shows a tolerance against cracks induced therein compared with the InGaN contact layer. Moreover, the AlGaN contact layer with aluminum (Al) composition smaller than 10% may effectively prevent the 2DEG induced in the interface between the contact layers, 7 and 8, and the channel layer 4, because the Al composition smaller than 10% may further make a difference small in the lattice constant between the AlGaN contact layer and the GaN channel layer, which may further restrict the selectively grown AlGaN contact layer from inducing cracks.

Figure 9A:
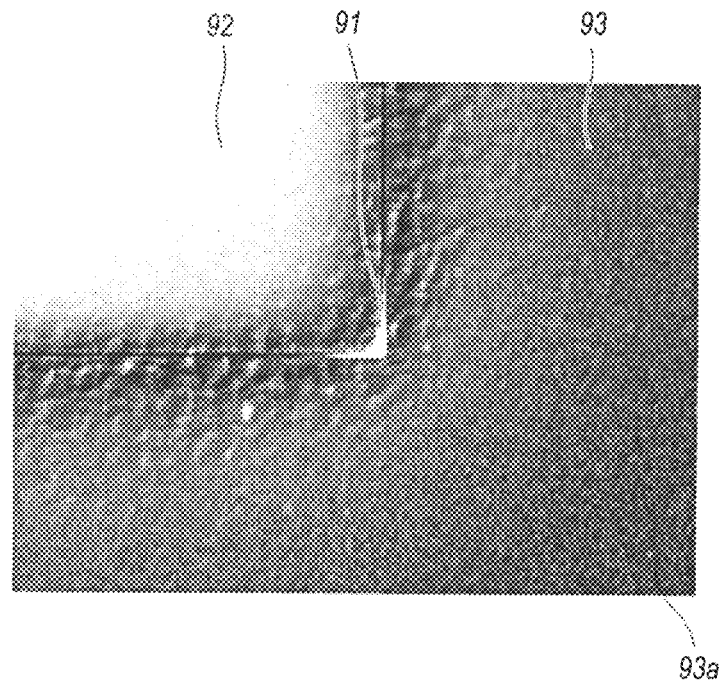
FIG. 9A is a photograph of surfaces of an AlGaN layer selectively grown at 800° C. and the mask, and FIG. 9B magnifies the surface of the first region shown in FIG. 9A.

Surface morphologies of the AlGaN contact layer, 7 and 8, will be investigated referring to figures, where FIG. 9A is a photograph showing a surface of the selectively grown AlGaN contact layer in the first region 92, namely, within the recess, and that of the mask 31, where the AlGaN layer was grown at 800° C. and 100 Torr (133 kPa) using the TMG, the TMA, and ammonia ($NH_3$) as the source materials for gallium (Ga), aluminum (Al), and nitrogen (N), respectively, accompanied with silane (SiH$_4$) as a source material for Si. The grown AlGaN layer has the aluminum (Al) composition of 5%.

Figure 9B:
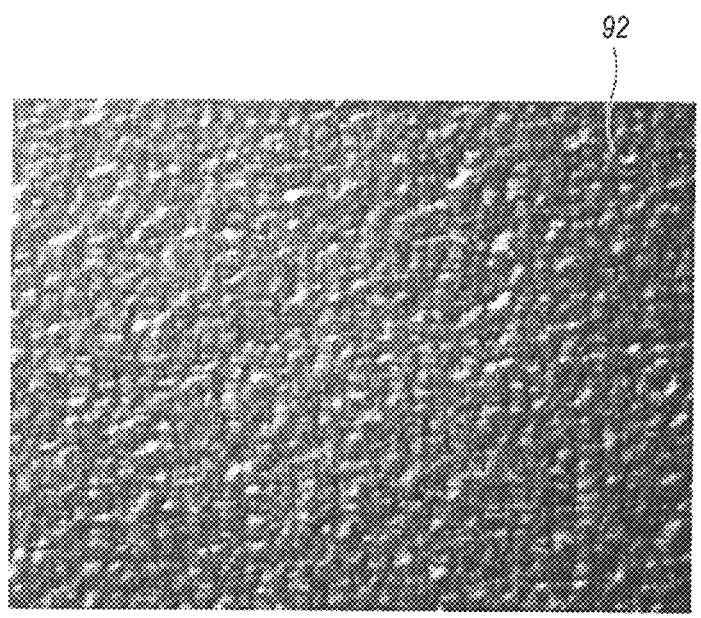

FIG. 9A showed the boundary 91 and the first and second regions, 92 and 93, divided by the boundary 91. The first region 92 is the selectively grown region, while, the second region 93 is the area out of the recess. Substantial undulation similar to those recognized in the surface of the semiconductor stack S, which is observable through the mask 31 like those shown in FIG. 5A and FIG. 8A, appeared on the surface of the first region 92. FIG. 9B magnifies the surface of the first region 92, which also shows a substantially no shade but the undulation. The second region 93 shown in FIG. 9A seemed to show no residues but, as indicated in FIG. 9A, many residues 93a were accumulated on the mask 31 in a portion apart from the edge thereof such that the residues 93a were not viewed as an isolated pattern.

Figure 10A:
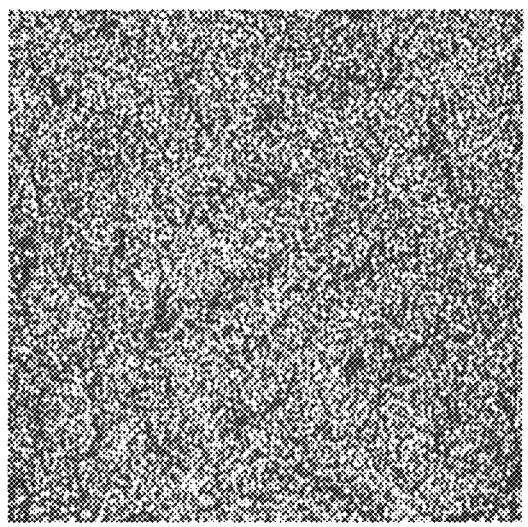
Figure 10B:
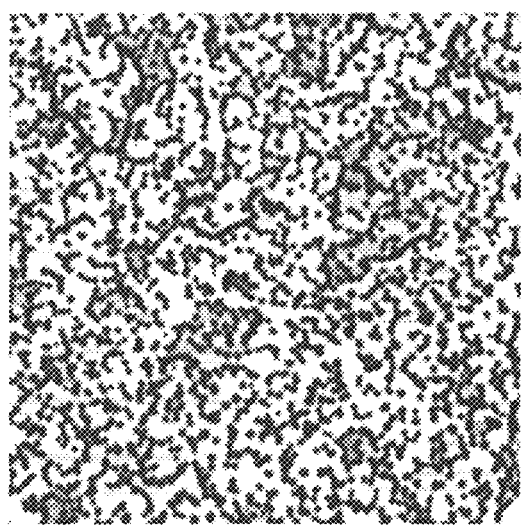
FIG. 10B shows that of the n-type AlGaN layer each selectively grown within the recess.

Thus, the n-type AlGaN contact layers, 7 and 8, may enhance the quality of the HEMT1 compared with a HEMT having the n-type GaN contact layer. FIG. 10A shows a surface of the n-type GaN layer, while, FIG. 10B shows that of the n-type AlGaN layer each selectively grown within the recess using nitrogen (N) as the carrier gas. As shown in FIGS. 10A and 10B, the selectively grown AlGaN layer in the surface thereof shown in FIG. 10B may cause more pits; while, that of the GaN layer shown in FIG. 10A causes substantially no pits. Many pits may equivalently widen the surface of the grown layer, which may decrease the contact resistance of the electrode formed thereon.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. For instance, the HEMT 1 of the embodiment provides the cap layer 6 on the barrier layer 5; but the HEMT 1 may omit the cap layer 6. Also, the semiconductor stack S may include other layers except for the buffer layer 3, the channel layer 4, the barrier layer 5, and the cap layer 6. Accordingly, the embodiments were chosen and described in order to best explain the principles of the invention, thereby to enable others skilled in the art to best utilize the invention and various embodiments with various modifications as are suited to the particular use contemplated. It is intended that the scope of the invention be defined by the claims appended hereto and their equivalents.

What is claimed is:

1. A process of forming a semiconductor device primarily made of nitride semiconductor materials, the process comprising steps of:
   growing a semiconductor stack including a buffer layer, a channel layer and a barrier layer sequentially on a substrate, the buffer layer being made of aluminum nitride (AlN), the channel layer being made of gallium nitride (GaN);
   patterning a mask on the semiconductor stack;
   etching a portion of the barrier layer and a portion of the channel layer in the semiconductor stack by using the mask to form a recess in the semiconductor stack; and
   growing a contact layer selectively on the channel layer within the recess by using nitrogen (N$_2$) as a carrier gas, tri-ethyl-gallium (TEG) as a source material for gallium (Ga), and silane (SiH4) as a source gas for n-type dopant at a temperature lower than 800° C. the contact layer being doped with silicon (Si) or Germanium (Ge) to a density of at least $5\times10^{19}$ cm$^{-3}$ and having a thickness greater than 100 nm, whereby the contact layer has a sheet resistance smaller than 100 ohm/square.

2. The process according to claim 1,
   wherein the contact layer is gallium nitride (GaN) doped with silicon (Si) or Germanium (Ge) to a density of $5\times10^{19}$ to $5\times10^{20}$ cm$^{-3}$.

3. The process according to claim 1,
   wherein the contact layer is one of indium nitride (InN) and indium gallium nitride (InGaN) doped with silicon (Si) or Geranium (Ge) to a density of $5\times10^{19}$ to $5\times10^{20}$ cm$^{-3}$.

4. The process according to claim 1,
   wherein the contact layer is aluminum gallium nitride (AlGaN) doped with silicon (Si) or Germanium (Ge) to a density of at least $1\times10^{20}$ cm$^{-3}$.

5. The process according to claim 4,
   wherein the contact layer has an aluminum (Al) composition smaller than 10%.

6. The process according to claim 1,
   wherein the step of growing the contact layer leaves residues on the mask, and
   wherein the process further includes a step of removing the residues by an alkali etchant.

7. The process according to claim 6,
   wherein the step of removing the residues includes a step of soaking the semiconductor stack in a solution containing ammonium hydro-oxide, hydrogen peroxide, and water at 60° C.

8. The process according to claim 1,
   wherein the step of growing the contact layer leaves residues on the mask,
   wherein the mask is made of inorganic materials containing silicon (Si), and
   wherein the process further includes a step of soaking the mask in fluoric acid to lift-off the residues on the mask.

9. The process according to claim 1,
   wherein the semiconductor stack further includes a cap layer on a top thereof, and
   wherein the step of etching further includes a step of partially etching the cap layer.

* * * * *